US006653732B2

(12) United States Patent
Alpern et al.

(10) Patent No.: US 6,653,732 B2
(45) Date of Patent: Nov. 25, 2003

(54) ELECTRONIC COMPONENT HAVING A SEMICONDUCTOR CHIP

(75) Inventors: Peter Alpern, München (DE); Thomas Herzog, Weilheim (DE); Wolfgang Sauert, München (DE); Heinz Schauer, Erding (DE); Rainer Tilgner, München (DE)

(73) Assignee: Infineon Technologies AG, Munich (DE)

( * ) Notice: Subject to any disclaimer, the term of this patent is extended or adjusted under 35 U.S.C. 154(b) by 17 days.

(21) Appl. No.: 09/850,587

(22) Filed: May 7, 2001

(65) Prior Publication Data

US 2002/0047184 A1 Apr. 25, 2002

(30) Foreign Application Priority Data

May 5, 2000 (DE) .......................... 100 21 865

(51) Int. Cl.[7] .............................................. H01L 23/48
(52) U.S. Cl. ...................... 257/753; 257/620; 257/760; 438/462; 438/626
(58) Field of Search ................ 257/620, 753, 257/760; 438/462, 626

(56) References Cited

U.S. PATENT DOCUMENTS 5,468,541 A * 11/1995 Hsu ........................... 428/210
5,950,107 A    9/1999 Huff et al.
5,977,639 A * 11/1999 Seshan et al. ............... 257/776
6,144,099 A * 11/2000 Lopatin et al. .............. 257/758
6,303,977 B1 * 10/2001 Schroen et al. ............. 257/635
6,468,894 B1 * 10/2002 Yang et al. .................. 438/622

FOREIGN PATENT DOCUMENTS

| DE | 44 37 081 A1 | 4/1995 |
| DE | 197 23 062 A1 | 1/1998 |
| EP | 0 040 560 B1 | 11/1981 |
| EP | 0 262 575 B1 | 4/1988 |
| EP | 0 635 885 B1 | 1/1995 |

* cited by examiner

Primary Examiner—Amir Zarabian
Assistant Examiner—Jeff Vockrodt
(74) Attorney, Agent, or Firm—Laurence A. Greenberg; Werner H. Stemer; Gregory L. Mayback

(57) ABSTRACT

An electronic component includes a semiconductor chip and/or a test structure. The semiconductor chip includes a multi-layer coating having at least one interconnect layer, at least one insulation layer, and at least one planarization layer. A method of producing the component is also disclosed. Embedded adhesion regions are provided in the planarization layer, whereby the adhesion regions provide adhesion surfaces to the adjacent insulation layers.

4 Claims, 6 Drawing Sheets

ELECTRONIC COMPONENT HAVING A SEMICONDUCTOR CHIP

BACKGROUND OF THE INVENTION

Field of the Invention

The invention relates to an electronic component having a semiconductor chip comprising a multi-layered coating that includes at least one interconnect layer, one insulation layer, and one planarization layer.

Planarization layers manifest problems adhering to insulation and/or interconnect layers, particularly in view of that fact that their thermal coefficient of expansion is not suited to the expansion behavior of the insulation layers and/or interconnect layers at all processing temperatures that arise in the process of manufacturing the electronic component. The danger of a detachment of the planarization layer increases in correspondence to the distance from the thermo-mechanical neutral point of the semiconductor chip, which is located in the geometric center of the surface of the active semiconductor chip given a symmetrical construction of the semiconductor structures, the structured insulation layers and the structured interconnect layers. Given an asymmetrical construction of a multi-layer coating of a semiconductor chip, the thermo-mechanical neutral point can be offset from the geometric center of the semiconductor chip. Despite this offset, the thermo-mechanical neutral point of a semiconductor chip is located in the vicinity of the geometric center of a semiconductor chip and thus in the center region. Thus, the problem regions with respect to the adhesion of the planarization layer to insulation layers are situated in the corner regions of a semiconductor chip.

SUMMARY OF THE INVENTION

It is the object of the invention to prevent the disengagement or displacement of a planarization layer from a semiconductor having a multi-layer coating.

This object is achieved with the subject matter of the independent claim. Additional advantageous developments of the invention derive from the subclaims.

According to the invention, the planarization layer comprises a glass layer having embedded adhesion regions which provide adhesion surfaces to neighboring insulation layers. These embedded adhesion regions have the advantage that they can be inserted in all problem zones of the planarization layer. Since the adhesion surfaces of the adhesion regions are fixed in relation to the adjacent insulation layers, the glass layer is prevented from sliding and lifting off at these adhesion regions, and the glass layer is fixed between the adhesion regions. To this end, the adhesion regions are applied to the semiconductor chip having a multi-layer coating prior to application of the glass layer.

In an embodiment of the invention, the glass layer consists of a glass compound that is thrown or spun on and polished on the surface which is averted from the semiconductor chip for leveling purposes. When it is thrown or spun on, the glass compound initially covers not only the adhesion regions with their adhesion surfaces for adjacent insulation layers, but also covers unevennesses of the multi-layer semiconductor chip as well as through-contacts to underlying interconnects. Polishing the surface of the glass layer erodes it sufficiently to produce a plane that comprises glass layer regions, through-contact regions, and adhesion regions, so that additional insulation layers, interconnect layers and through-contacts can be built on this plane with a high degree of precision, a completely planar surface being available again for such further processing of the semiconductor chip.

In another development of the invention, the adhesion regions consist of a metal coating. Metal coatings on insulation layers on semiconductor chips have the advantage of adhering extremely durably, so that such a metal coating on the insulation layer of a multi-layer coating of a semiconductor chip fundamentally represents an obstacle to the sliding of the glass layer of the planarization layer.

When the ultimate layer structure subsequent to the planarization layer begins with an additional insulation layer, the adhesion areas are sandwiched between lower and upper insulation layers, to which metal coatings adhere particularly well, so that the region of the planarization layer which is occupied by the glass layer is prevented from sliding or disengaging from the underlying bottom insulation layer and/or the overlying top insulation layer.

In another embodiment of the invention, the adhesion regions of the planarization layer are denser in corner regions of the semiconductor chip than in the center region of the semiconductor chip. By extension, this advantageous embodiment of the invention may provide that no adhesion regions be arranged in the center region, and that the arrangement of adhesion regions be concentrated in the corner regions, especially since the corner regions in a semiconductor chip are located furthest from the thermo-mechanical neutral point of the semiconductor chip.

The adhesion regions can have a variety of shapes. In one embodiment of the invention, the planarization layer of the semiconductor chip comprises angular strips as the adhesion regions in corner regions of the semiconductor chip. The angles can be rectangular, with the legs of the angular strips growing shorter as the strips approach the center of the semiconductor chip. The stagger, i.e. the mutual spacing between the angular strips, can also be varied so that the spacing between the angular strips increases as they approach the center. The angular strips are interrupted at the locations at which through-contacts are required for contacting through to the bottom interconnect layers.

Another embodiment of the invention provides that the planarization layer of the semiconductor chip comprise adhesion regions with rounded contours. Rounded contours represent adhesion regions that do not comprise corners, vertices or indentations, so that microtear formation is not induced in the surrounding glass layer given cyclic thermal stress. For this reason, round, i.e. circular, adhesion regions are advantageous.

The adhesion regions are produced from materials whose adhesivity on insulation layers in semiconductor technology has been proven effective. In particular, in one embodiment of the invention the adhesion regions consist of an aluminum alloy coating. Aluminum alloys having small proportions of copper and/or silicon have proven effective and adhere permanently to the insulation layers, so that in an electronic component wherein adhesion regions consisting of aluminum alloys are embedded in the planarization layer, these regions can effectively adhere both to the underlying bottom insulation layer and to the subsequent overlying top insulation layer, and can thus prevent the material of the planarization layer from lifting or sliding off at the critical adhesion locations far from the thermo-mechanical neutral point of the semiconductor chip.

Since copper alloys are being used with increasing frequency in semiconductor technology for the interconnect layers, it is expedient to produce the adhesion regions in semiconductor chips having copper interconnect layers from copper alloys, in order to remain compatible with the respective process technologies.

A further object of the present invention is to optimize and test the geometry of the adhesion regions, their position on the chip, and the materials for the adhesion regions.

This object is achieved by an electronic component having a test structure on a semiconductor chip, which structure comprises a multi-layer coating including at least one interconnect layer, one bottom insulation layer, one top insulation layer, and one intermediate planarization layer with embedded adhesion regions, and which additionally comprises at least one test through-contact in the corner regions of its planarization layer, which extends through the planarization layer and is connected above and below the planarization layer to measuring interconnects.

The test through-contact has a microscopic diameter, given which it is possible to detect minimal displacements of the planarization layer. In this context, the term "microscopic" refers to dimensions that are measurable only with a light microscope. The corner region of a semiconductor chip is used for this test through-contact in order to test the greatest stress on the planarization layer to arise in the corner region. If the planarization layer detaches from the underlying insulation layer or shifts relative thereto, the test through-contact is interrupted, and a current is no longer able to pass via the interrupted test through-contact between the measuring interconnects, which are attached on the bottom of the planarization layer and the top of the planarization layer and connected to the test through-contact. If the planarization layer is prevented from disengaging or shifting relative to the underlying insulation layer by correspondingly optimized adhesion regions, then the test through-contact remains intact, and a measuring current can flow from the bottom measuring interconnect to the top measuring interconnect on the bottom and top sides of the planarization layer, respectively.

With this test structure on the semiconductor chip of an electronic component, the construction of the adhesion regions can be checked and optimized. In order to check the measurement of current which is performed by way of the measuring interconnects and the test through-contact, the semiconductor chip comprises a first measuring contact surface on the top side of the planarization layer, which is connected to the top measuring interconnect, and a second measuring contact surface on the top side of the planarization layer, which is connected to the bottom measuring track via a measuring through-contact through the planarization layer. As a consequence, a simple method of current measurement can be utilized to provide proof as to whether the adhesion regions of a semiconductor chip having a test structure are operating effectively, or it will be necessary to correct the surface-area ratio between the adhesion region and the planarization surface, the arrangement and distribution of the adhesion regions on the semiconductor chip, or the shape and size of individual adhesion regions and the type of adhesion material.

Comparably, test through-contacts can be arranged in the center region as well as the margin regions of the semiconductor chip in order to prevent misinterpretations of an interruption of the test through-contacts, given that interruptions, which are caused by cyclic thermal stresses of the semiconductor chip, of the test through-contact in the center region, i.e. in the vicinity of the thermo-mechanical neutral point of the semiconductor chip, are an indication that the cause of the interruption is not related to the embedded adhesion regions. If interruptions of the test through-contact occur only in the margin region and not in the center region, the adhesion regions require correction. If interruptions of the test through-contact occur neither in the center region nor in the margin region, the embedded adhesion regions have achieved their object completely. A method of manufacturing electronic components having planarization layers which is carried out on this basis can therefore be based on adhesion regions with guaranteed structures, giving rise to mass production of reliable electronic components having planarization layers.

In an embodiment of the invention, each electronic component of a semiconductor wafer comprises a test through-contact in a corner region. The space consumed by such a test through-contact having measuring interconnects represents only a small space and can nevertheless guarantee when adhesion problems have occurred on the semiconductor wafer between the planarization layer and the insulation layers.

In another embodiment of the test structure of a semiconductor chip, at least one corner region of the semiconductor chip comprises angular strips as adhesion regions. With the aid of the test structure, the reliability of these angular strips as adhesion regions can be examined very precisely; specifically, the reliability of an overall wafer or of an entire batch can be statistically determined during production.

Another embodiment of the test structure of a semiconductor chip provides that at least one corner region comprise square-shaped adhesion regions. Square adhesion regions can be distributed in a corner region uniformly or in different densities and have the advantage over an angular strip structure that their distribution can be varied more widely in the corner region of a semiconductor chip.

In another embodiment of the test structure of a semiconductor chip, rounded contours are provided as adhesion regions. In the extreme case, these rounded contours are circular adhesion regions. Rectangular and square surfaces that have rounded corners are possible as well. Semiconductor structures such as these have the advantage that voltage peaks cannot develop in the planarization layer, since sharp corners are completely avoided in the structure.

In another embodiment of the invention, several metal layers are provided in the semiconductor chip, which are jointly connected to a single test through-contact and which comprise a measuring interconnect, which is connected to the test through-contact, for each of the metal layers. For each of the metal track layers, a measuring contact surface is provided on the topmost interconnect layer, these being connected to the respective test through-contact via measuring lines by way of measuring through-contacts. The adhesivity of various insulation and planarization layers relative to one another is thus testable with the aid of a single test through-contact.

A method for producing an electronic component with a semiconductor chip and a multi-layer coating comprising interconnect layers and insulation layers and at least one planarization layer including adhesion regions comprises the following steps:

a) produce a semiconductor chip with first layers of a multi-layer coating in a layer sequence of at least one interconnect layer and at least one terminating insulation layer including through-contacts to the interconnect layer;

b) deposit a metallic adhesion layer on the terminating insulation layer of the first layer;

c) structure the adhesion layer into adhesion regions and through-contact regions;

d) apply a glass layer;

e) planarize the glass layer into a planarization layer which includes embedded adhesion-layer regions and through-contact regions;

f) complete the multi-layer coating by applying additional layers, beginning with an additional insulation layer.

With a method such as this, an electrical component is produced which comprises a planarization layer that is so fixed upon the multi-layer coating by embedded adhesion regions that shifting, displacement, or disengagement of the planarization layer cannot occur in critical areas located at a distance from the neutral thermal point of the semiconductor chip. To this end, before the material of the planarization layer is applied, an adhesion layer is applied in equal or greater thickness as that of the future planarization layer and when the adhesion layer is then structured, adhesion regions of the adhesion layer having a thickness slightly greater than or equal to that of the future planarization layer remain on the preceding insulation layer. Besides the adhesion regions, a metallic extension of the through-contacts to the interconnect layers beneath and between the insulation layers must be applied and structured in the process of structuring the adhesion layer. Because the adhesivity of the metals on the insulation layer, which are common metals for interconnects in semiconductor technology, has already been proven effective, the adhesion layer is also produced from a metal of this type, so that through-contact regions can also be realized during the process of structuring the adhesion layer into adhesion regions. These through-contacts should extend from the deeper metal layers to the future surface of the planarization layer, so that access to through-contacts of the deeper interconnect layers can also be created.

Following the structuring of the adhesion layer into adhesion regions and through-contact regions, the actual material of the planarization layer, namely a glass layer, is applied. This glass layer covers not only the intervening spaces between the adhesion regions but also the adhesion regions themselves as well as the through-contact regions. Furthermore, the surface of the glass layer exactly reproduces the unevennesses which emerged in the surface of the semiconductor chip in the preceding steps and were formed in the application of the first layers of the multi-layer coating. For this reason, in a subsequent step the glass layer, along with the embedded adhesion regions and through-contacts, undergoes chemical-mechanical polishing and erosion to a uniform level, whereby all unevennesses are eliminated, with the result that the planarized surface of the planarization layer substantially comprises the material of the glass layer, the adhesion surfaces, and the through-contacts.

For testing and checking purposes, a somewhat differently constructed electronic component is produced, which comprises a test structure on a semiconductor chip. This test structure on a semiconductor chip was invented in order to be able to demonstrate the adhesivity, or the improvement of adhesion, conditioned by the adhesion regions, and to be able to detect errors in the adhesion of the planarization layer during production. To accomplish these aims, the test structures realized on the semiconductor chip are produced by the following method:

a) Produce a semiconductor chip having at least one bottom insulation layer and at least one bottom interconnect layer on the bottom insulation layer;

b) structure the bottom interconnect layer into at least one bottom measuring interconnect;

c) apply an adhesion layer;

d) structure the adhesion layer into adhesion regions, at least one test through-contact at one end of the measuring interconnect, and at least one measuring through-contact at the other end of the measuring interconnect;

e) apply a glass layer to the bottom insulation layer with the structured adhesion layer;

f) planarize the glass layer into a planarization layer including adhesion layer regions and the test through-contact and the measuring through-contact;

g) apply a top insulation layer on the planarization layer having through-contact openings to the test and measuring through-contacts;

h) apply an interconnect layer having at least one top measuring interconnect and measuring contact surfaces for top and bottom measuring interconnects.

The product of this method is an electronic component having a test structure with which it is possible not only to test the reliability performance of new adhesion layer regions embedded in a planarization plane with respect to their ability to check for disengagement or shifting of the planarization layer relative to the bottom and top insulation layers, but also to continuously monitor finished semiconductor chips having planarization layers. To this end, in this method at least one test through-contact is created in the planarization layer extending from an interconnect layer beneath the planarization layer to an interconnect layer above the planarization layer, i.e. through the entire thickness of the planarization layer. This test through-contact can be microscopic, because this itself is not intended to be furnished with pivots of a testing device. Rather, a measuring interconnect is disposed in the interconnect layer situated beneath the planarization, which is connected to the bottom end of the test through-contact and leads from there to a measuring through-contact which is connected to a measuring contact surface on the top side of the planarization layer.

The measuring contact surface which is electrically connected to the bottom end (or the beginning) of the test through-contact, by way of the measuring through-contact and a bottom measuring interconnect, can be constructed large enough that either continuing measuring wires can be installed on this measuring contact surface, or pivots of a corresponding testing device can be installed. The top end of the test through-contact, which is microscopic just as the test through-contact itself, is connected to a measuring interconnect on the top surface of the planarization layer or on the surface of the top insulation layer, while the free end of the measuring interconnect flows into a measuring contact surface on which a second pivot of a testing device can be installed or a measuring wire can be attached. Upon completion of the steps for producing a test structure on a semiconductor chip and possible thermo-test cycles, it can be determined between the two measuring contact surfaces or the attached measuring wires whether or not the test through-contact has been interrupted by the thermal treatment owing to displacement of the planarization layer relative to the top or bottom insulation layer.

One alternative for executing the method, the adhesion layer is applied by a sputter method. To this end, a source material consisting of the material of the adhesion layer is sputtered in a vacuum apparatus and simultaneously applied to the insulation layer that underlies the planarization layer. The source material consists of a metal alloy which is provided for the adhesion regions and which can correspond to the metal alloy for the interconnect layers.

Another development for executing the method provides that the adhesion layer be applied by evaporation. Here, the source material for the adhesive material of the adhesion regions is liquefied in a cup or vessel and vaporized onto the surface of the insulation layer underlying the future planarization layer.

The adhesion layer can also be applied by the decomposition of metalorganic substances in a vapor phase deposition method. Here, a metalorganic substance is converted into the vapor phase and guided over the insulation layer that underlies the future planarization layer, whereby the metal of the metalorganic compound settles on the insulation layer from the vapor phase.

Because in these methods for applying the adhesion layer the whole area of the bottom insulation layer is covered with a metal alloy, this must be structured into adhesion regions and through-contact regions in a subsequent step. The through-contact regions provide for electrical connections through the planarization layer to the bottom interconnect layers, whereas the adhesion regions themselves should be embedded within the planarization layer and between the bottom and top insulation layers in a fully insulated fashion.

In a development for executing the method, this type of structuring of the adhesion layer can be accomplished by a masking method using a photolithography technique. Upon the application of a structured mask to the adhesion layer using this technique, the regions in which an embedded layer is to be applied are dry-etched away by a plasma etching method or are alternatively removed by a wet chemical method. Next, the adhesion regions and the through-contact regions on the bottom insulation layer are covered by the adhesion layer, and a glass layer can be applied to the surface so as to cover the whole surface, including the adhesion layer regions and the through-contact regions.

The glass layer can be applied by a throwing or spraying method with a subsequent drying process. The advantage of these methods is that they make it possible to produce an arbitrarily thick glass layer on the bottom insulation layer.

The glass layer can also be applied by the sputter method or by deposition from a plasma. These methods are distinguished by the extreme purity of the applied layers, since both methods are executed in a vacuum. Another possibility for carrying out the method is to apply the glass layer by chemical vapor-phase deposition.

Once the glass layer has been applied, all unevennesses of the underlying surface of the semiconductor and the multilayer coating are reproduced on the top surface of the glass layer. Therefore, these unevennesses are eroded in a chemical-mechanical method, forming a planarization layer. This planarization layer makes it possible to build subsequent layers based on a wholly planar surface. First, an additional insulation layer is applied, which comprises a very good bond to the adhesion regions and in which through-openings are installed at the locations at which the through-contacts to the bottom interconnect structures are disposed. These through-contacts can be connected to one another by way of a metallic interconnect structure on the insulation layer or can be led to contact surfaces of the semiconductor chip. Lastly, a passivation layer is placed on this structure, which is intended to protect the interconnects and which comprises openings only at locations at which contact surfaces of the semiconductor chip are provided.

DESCRIPTION OF THE PREFERRED EMBODIMENTS

Figure 1:
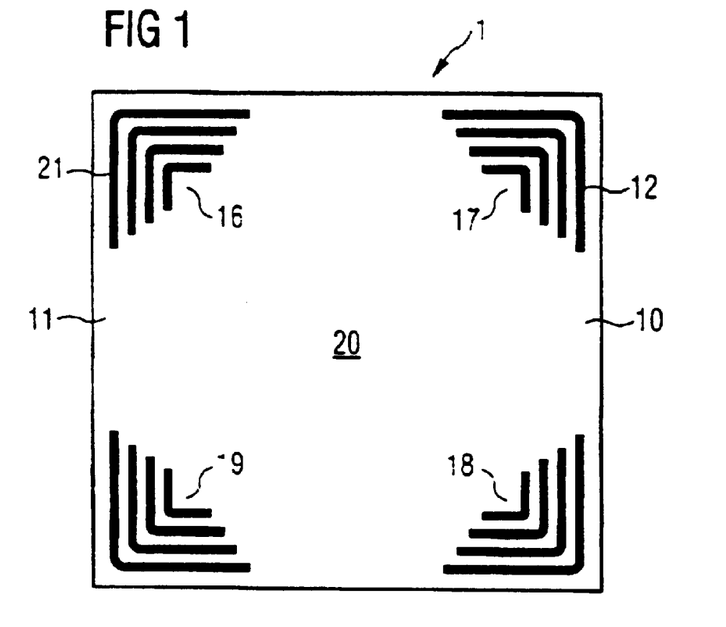
FIG. 1 a plan view of a first embodiment of the invention having angular strips as adhesion regions in the corner regions of a semiconductor chip.

Referring now to the figures of the drawings in detail and first, particularly to FIG. 1 thereof, there is shown a plan view of a first embodiment of the invention having angular strips 21 as adhesion regions 12 in the corner regions 16, 17, 18 and 19 of a semiconductor chip 1. In this first embodiment, a planarization layer 10 is applied on a semiconductor chip which carries an electronic integrated circuit that connects individual active and passive structural elements on the surface of the semiconductor chip to one another and completely insulates them by way of at least one interconnect layer and one insulation layer, respectively. This planarization layer 10 is substantially formed of a glass layer 11 and the angular strips, which are visible in this plan view as the adhesion regions 21 in the corners 16, 17, 18, and 19 of the semiconductor chip 1.

A planarization layer without these adhesion regions 12 exhibits malfunctions in that the planarization layer tends to disengage or to displace or shift relative to the underlying bottom insulation layer in regions furthest removed from the thermo-mechanical neutral center region 20 of the semiconductor chip 1, namely corner regions 16, 17, 18 and 19. In order to eliminate this error, in this embodiment the corner regions are provided with the angular strips 21 as adhesion regions 12, which provide a good adhesion surface to the underlying bottom insulation layer and to the adjoining top insulation layer as well, which has been omitted from this view for the sake of showing the angular strips 21 of the adhesion regions 12. These adhesion surfaces prevent the planarization layer from shifting relative to the underlying and overlying insulation layers. In practical terms, the planarization layer is held together in the corner regions by the angular strips 21 and can no longer shift relative to the bottom and top insulation layers.

On its part, the planarization layer 10 provides for the compensation of all unevennesses which emerge on the semiconductor chip surface as a result of both the insertion of the individual active and passive elements of an integrated circuit and the application of a multi-layer coating, and further provides for the emergence of through-contacts through the planarization layer by way of through-openings in the planarization layer (which are not included in the Figure), said through-contacts being connected to the interconnect layers beneath the planarization layer.

Figure 2:
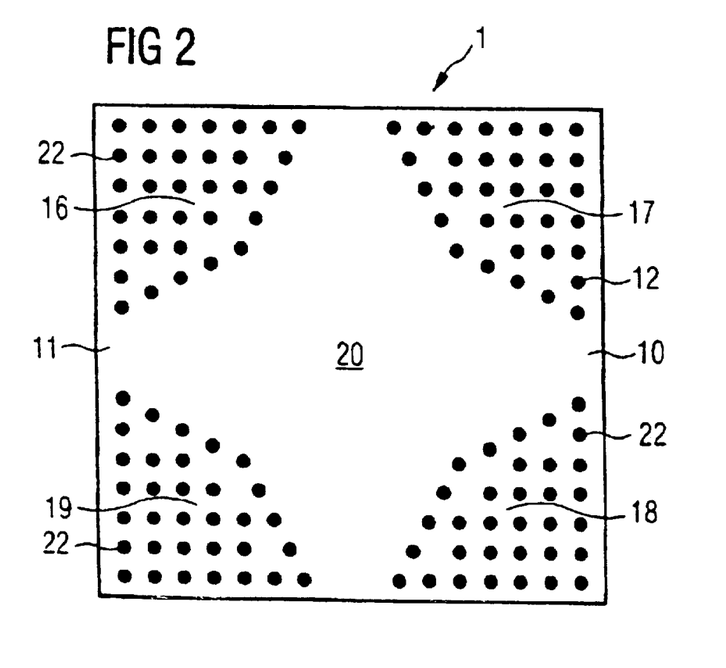
FIG. 2 a plan view of a second embodiment of the invention having circular adhesion regions in the corner regions of a semiconductor chip.

FIG. 2 shows a plan view of a second embodiment of the invention having adhesion regions 22 in the corner regions 16, 17, 18 and 19 of a semiconductor chip 1. The advantage of such circular adhesion regions 22 is that sharp corners or edges do not emerge, and thus microtears, which act to suppress peak voltages, do not emerge in the planarization layer. Furthermore, as shown in FIG. 2, the adhesivity of the planarization layer, i.e. the hindering of its thermal expansion, can be enhanced by the increasing densities of the circular adhesion regions 22 as they approach the margin of the chip 1. The more circular adhesion regions 22 are provided in the problem zones of the semiconductor chip, the more reliably defects that are caused by the planarization layer can be prevented. This representation in FIG. 2 also omits the through-contacts through the planarization layer to the lower, or underlying, interconnects.

The FIGS. 3 to 13 show stages of production for producing an electronic component of an inventive embodiment. This series of representations in FIGS. 3 to 13 essentially serves to lay plain the emergence of the extreme unevennesses on a semiconductor chip and to show how these differences of a multi-layer coating are leveled out by the planarization layer. At the same time, these FIGS. 3 to 13 clearly demonstrate that no additional steps are needed to embed the inventive adhesion regions, but rather these adhesion regions emerge simultaneously with the through-contacts that must be arranged in the planarization layer.

Figure 3:
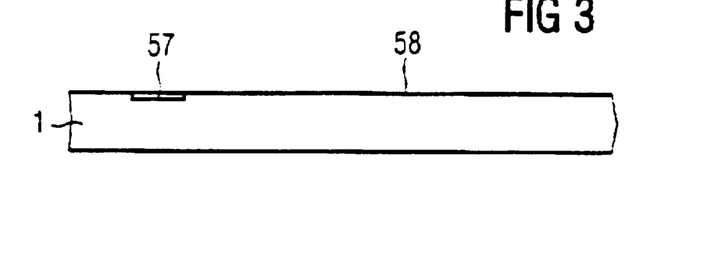
FIGS. 3 to 13 are fragmentary, cross-sectional views of various stages of production of an electronic component according to the invention.

FIG. 3 shows a semiconductor chip 1 having a microscopic contact surface 57 at its surface 58. In this context, the term "microscopic" refers to a dimension that can only be seen by the human eye with the aid of a light microscope. The surface 58 of the semiconductor chip is represented herein as a straight line; however, in reality the surface 58 is already extremely uneven and strewn with a number of gradings on the surface, since various selective oxidation steps, masking steps, and doping steps have been carried out on the surface 58 of the semiconductor chip 1. These gradings are omitted from FIG. 3 and subsequent Figures for purposes of simplification, though they are smoothed or leveled with the planarization layer like the other unevennesses produced by the varied layers of the coating.

Figure 4:
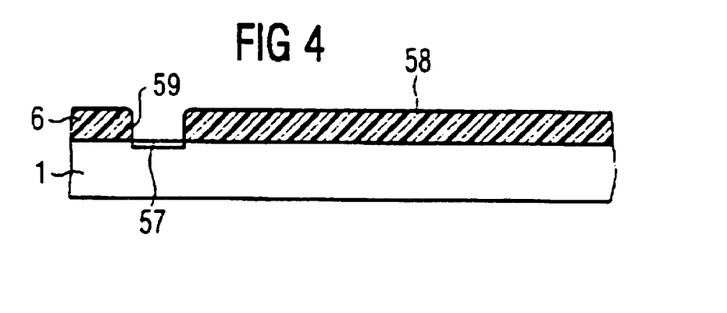

FIG. 4 shows a first insulation layer 6, which is applied directly to the semiconductor surface to protect the underlying passive and active elements of an electronic circuit. This insulation layer 6 is a non-conductive dielectric and can be produced from various oxides or nitrides. A silicon oxide layer that has been applied by wet or dry oxidation is usually utilized. Through-openings 59 which expose the microscopic contact surfaces 57 of the semiconductor chip 1 are installed in this first and, thus, bottommost insulation layer 6.

Figure 5:
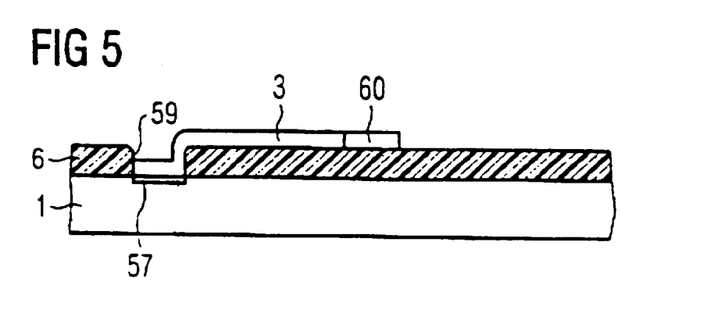

FIG. 5 shows the emergence of a first interconnect layer 3, with which various electrodes of the active and passive semiconductor elements of an integrated circuit are connected to one another and which lead to contact terminal surfaces 60 of the first interconnect layer 3. An additional insulation layer 7 for a multi-layer coating of the semiconductor chip can be applied over this interconnect layer 3.

Figure 6:
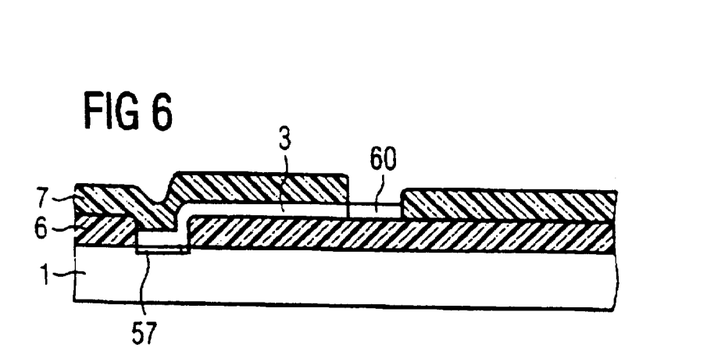

FIG. 6 shows a semiconductor chip 1 with a two-layer insulation coating and an intermediately disposed interconnect layer 3. The two-layer insulation coating emerges by the application, as represented in FIG. 6, of an additional insulation layer 7 on the interconnect layer 3 of FIG. 5. This insulation layer 7 is laid in a uniform thickness over the whole structure, so that the unevennesses of the preliminary structures are reproduced at the surface of the insulation layer, as can be seen in FIG. 6. The insulation layer 7 is, consequently, thicker over the interconnects of the interconnect layer 3 than in the remaining regions by the thickness of the interconnects, and it is thinner over the microscopic contact surfaces of the chip by a corresponding thickness. Essentially four different surface levels can be distinguished in FIG. 6: first, a level obtained by adding the thicknesses of the insulation layers 6 and 7; second, a level obtained by adding the thickness of the first insulation layer 6 to the thickness of the first interconnect layer 3; third, a level obtained by adding the thicknesses of insulation layer 6, interconnect layer 3, and insulation layer 7; and fourth, a level obtained by adding the thickness of interconnect layer 3 over the microscopic contact surface 57 to the overlying thickness of the insulation layer 7.

Figure 7:
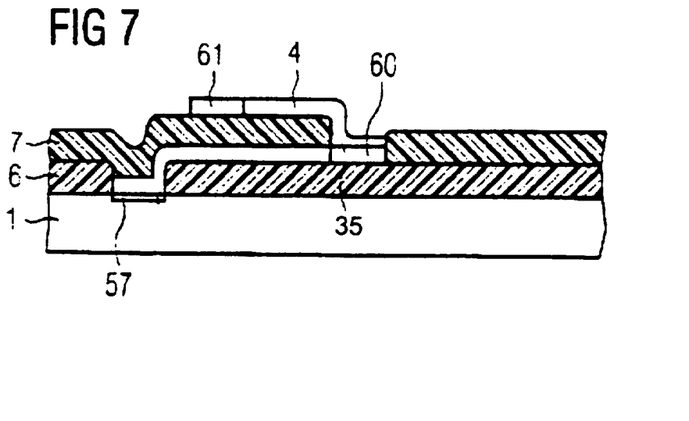

FIG. 7 shows the construction of an additional interconnect layer 4, which introduces two additional levels in the scale of the unevennesses of a semiconductor chip, by virtue of the fact that this second interconnect layer 4 contacts the exposed contact surface 60 in a through-opening of the insulation layer 7 by way of a through-contact 35. Additional interconnects in the interconnect layer 4 connect to this through-contact. On its part, the interconnect layer 4 forms contact surfaces 61.

Figure 8:
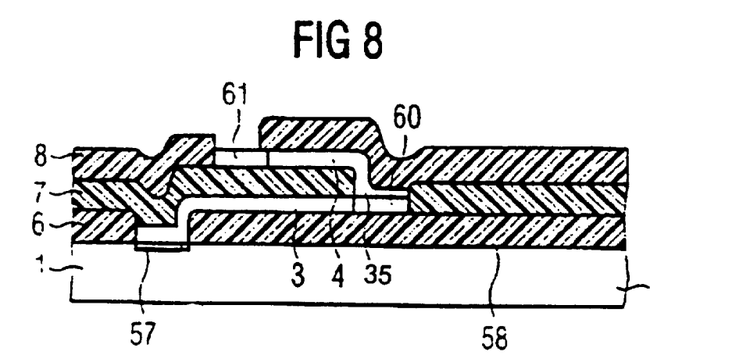

FIG. 8 shows the application of an additional insulation layer 8 to the structure that emerges as a result of the interconnect layer 4. In the additional steps, preparations are now made at the level of the insulation layer 8 for the formation of a planarization layer. The existing layers include three insulation layers 6, 7 and 8, and two interconnect layers 3 and 4, which already exhibit sharp unevenness on the surface, as represented in FIG. 8. In addition to the unevenness, there are also grades in the surface 58 of the semiconductor, so that the insertion of a planarization step or a planarization layer appears necessary at this stage of production.

Figure 9:
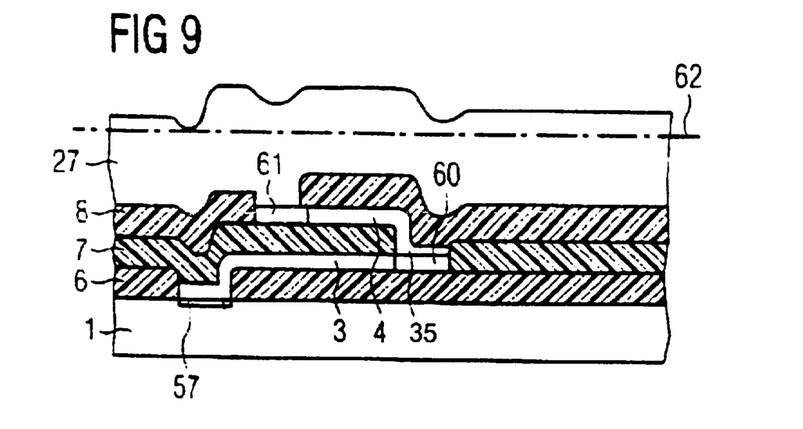

FIG. 9 shows the application of a metallic adhesion layer 27, which must be applied at least in a thickness which reaches the planarization level 62 in all regions.

Figure 10:
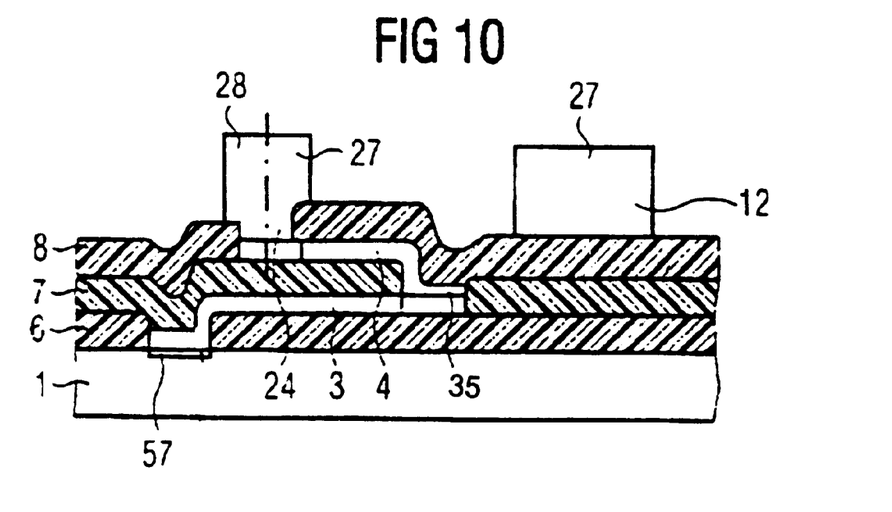

FIG. 10 shows the structuring of the metallic adhesion layer 27 of FIG. 9 into through-contact regions 28, which maintain an electrical contact to the underlying interconnect layers 3 and 4, and adhesion regions 12, which consist of the same material and which also emerge from the metallic adhesion layer 27 of FIG. 9 given selective etching. The structuring of the metallic adhesion layer 27, as is represented in FIG. 10, can be accomplished by various wet and dry etching methods. Because the adhesion layer material of the adhesion layer region 12 is the same material as the material of the through-contact 28, an adhesion layer region can be produced simultaneously with the production of the through-contacts 28 in the planarization layer without additional steps.

Figure 11:
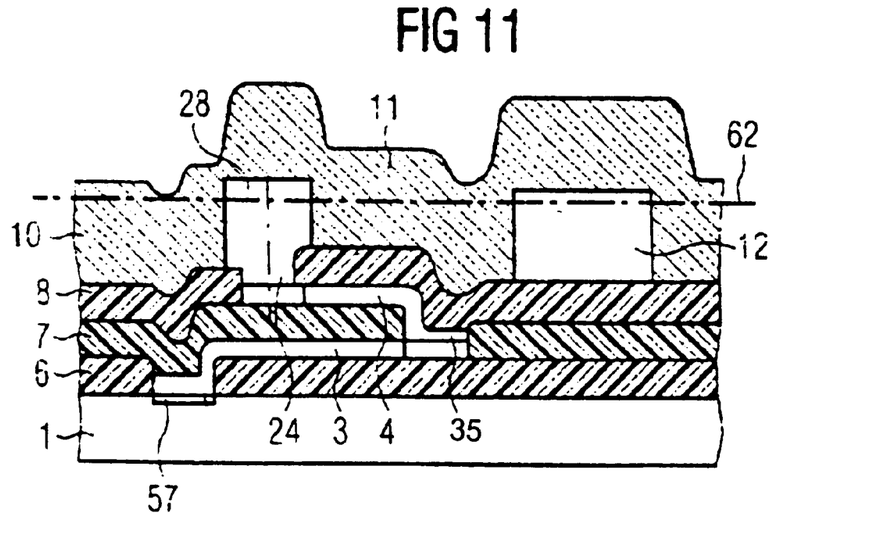

FIG. 11 shows the application of a glass layer 11 to the whole surface of the as yet extremely uneven semiconductor chip, with the planarization level 62 indicated by a dotted line. The unevennesses of the glass layer 11 that is thrown on do not stem from the characteristics of the glass layer, nor are they conditioned by methodological errors; rather, the glass layer reproduces the various level grades of the preceding coating and therefore exhibits extreme differences in the thickness scale of the underlying multi-layer coating.

Figure 12:
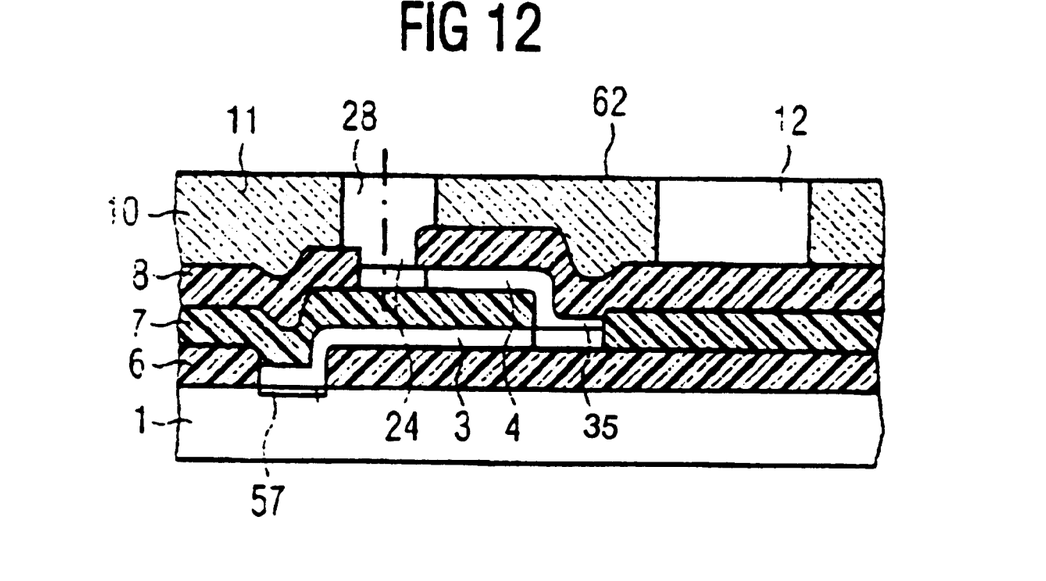

FIG. 12 shows the leveled planarization layer 11 subsequent to chemical-mechanical polishing. All unevennesses visible in FIG. 11 have been leveled to a planarization level 62. The surface at the planarization level 62 now comprises regions of the glass layer, as well as adhesion regions 12 of the metallic conductor material, and through-contact regions 28 for continuing the electrical connection to the bottom interconnect layers.

Figure 13:
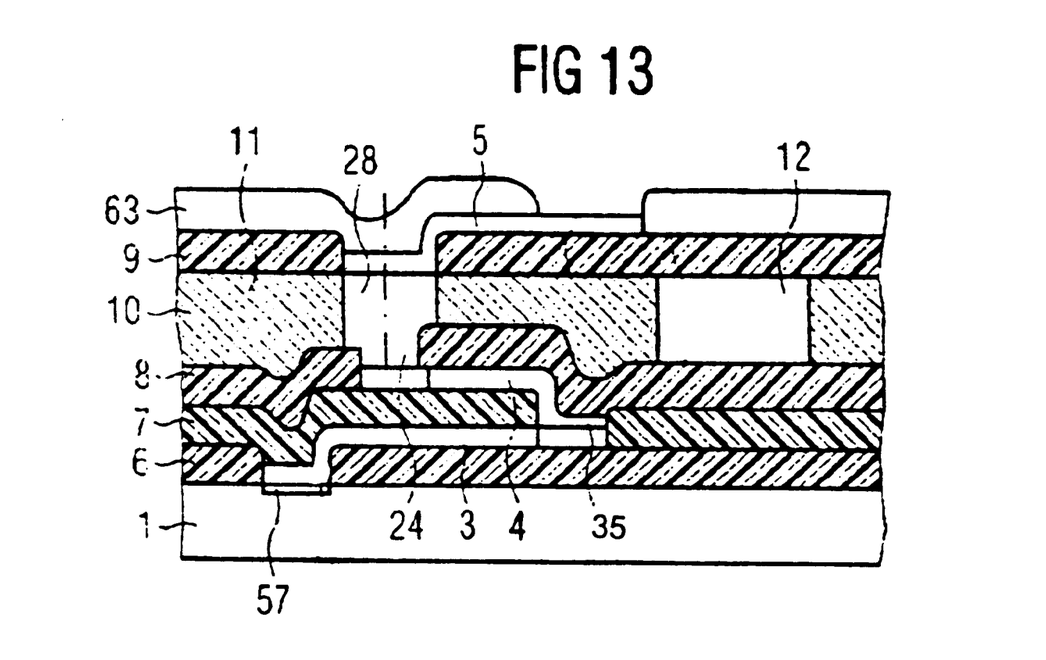

FIG. 13 shows the remaining multi-layer structure subsequent to planarization of the surface of the semiconductor chip, whereby an additional insulation layer 9 is first applied, which forms surfaces that adhere to the adhesion regions 12 effectively. This insulation layer 9 has through-contact openings through which an additional interconnect layer 5 accesses the through-contact 28. Lastly, a passivation layer 63 can be applied, which consists substantially of an insulating material and which comprises through-contact openings to corresponding contact surfaces of the interconnect layer 5. These contact surfaces are the required size to allow access for additional connection steps such as bonding steps.

Figure 14:
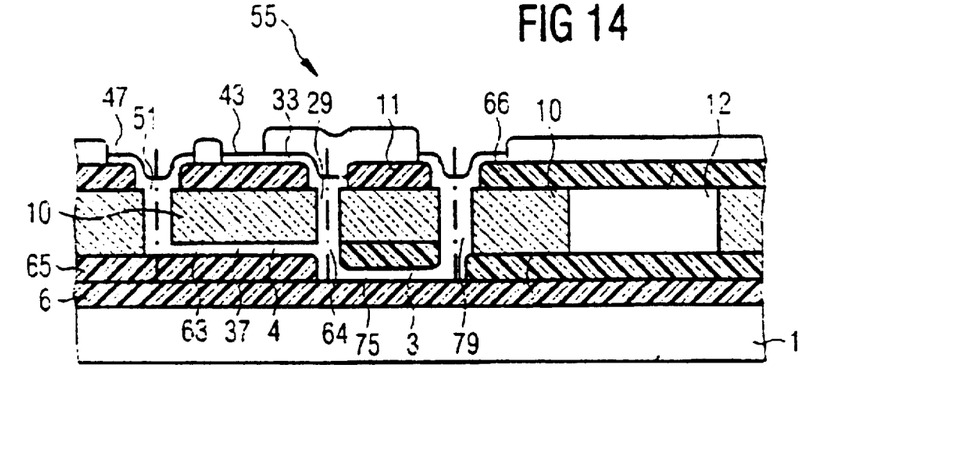
FIG. 14 a schematic cross-section through a semiconductor chip having a test structure.

FIG. 14 shows a schematic cross-section through a semiconductor chip 1 having a test structure 55. The test structure 55 is substantially based on a test through-contact 29. This test through-contact in the planarization layer 10 is a microscopic test column 64, which is referenced as test through-contact 29 and which reacts extremely sensitively to shifts relative to the insulation layer 65 beneath the planarization layer 10 and the top insulation layer 66 above the planarization layer. As soon as shifts occur between the top or bottom insulation layers 65, 66 and the planarization layer 10, the test through-contact 29, i.e. the microscopic test column 64, is destroyed or fractured, so that the interruption of the microscopic test column 64 can be measured with the aid of a measuring contact surface 47 by way of a measuring contact 51, measuring interconnect 37, which is connected to the bottom end of the test through-contact 29, and with the aid of a measuring contact surface 43, which contacts the top end of the test through-contact 29 by way of a measuring interconnect 33. As long as an ohmic connection between the measuring contact surfaces 47 and 43 can be detected, the test runs positive, and all the cyclic thermal stresses on the chip have failed to cause disengagement, shifting or displacement of the planarization layer. As soon as an interruption is detected, it can be proven with the aid of this test structure 55 that the planarization layer 10 has moved relative to the insulation layers 65 and 66.

Figure 15:
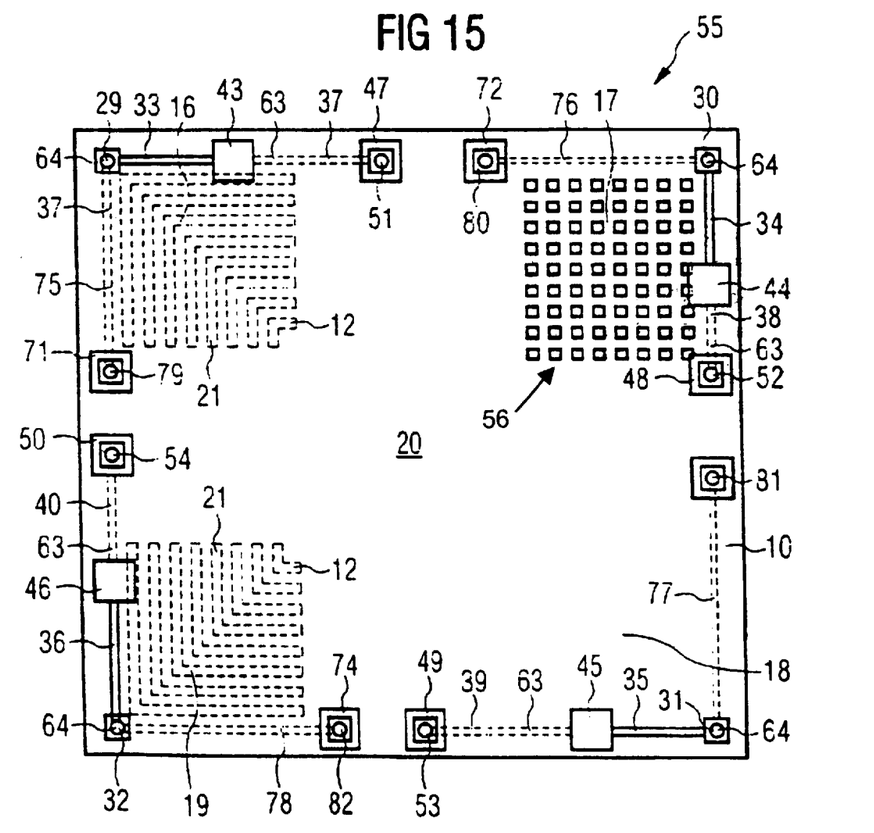
FIG. 15 a plan view of a semiconductor chip having a test structure of a third inventive embodiment, which has various test regions.

FIG. 15 shows a plan view of a semiconductor chip 1 having a test structure 55 of a third inventive embodiment which includes various test adhesion regions. In FIG. 15, the corner region 18 of the semiconductor chip 1 is entirely without adhesion regions, whereas the planarization layer 10 includes square regions 56 as embedded adhesion regions 12 in its corner region 17 and angular strips 21 as adhesion region 21 in the other corner regions 16 and 19. Each of the corners respectively includes test through-contacts 29, 30, 31, and 32, i.e., test columns 64, which provide the proof as to whether the embedded adhesion regions 21 and 56 the adhesion of the planarization layer has been improved relative to the corner region 18 which lacks adhesion regions. To this end, FIG. 15 shows first measuring contact surfaces 43 to 46, which contact the top end of the test through-contacts 29 to 32 by way of top measuring interconnects 33 to 36, and second measuring contact surfaces 47 to 50 on the surface of the semiconductor chip 1, which contact the bottom end of the test through-contacts 29 to 32 by way of measuring through-contacts 51 to 54 and bottom measuring interconnects 37 to 40. The test through-contacts 29 to 32 between the measuring contact surfaces 43 to 46 and the measuring contact surfaces 47 to 50 are tested after several thermal cycles, and it is determined whether an ohmic connection still exists between the measuring contact surfaces 43 to 46 and the measuring contact surfaces 47 to 50, or the test through contacts 29 to 32 have been interrupted. Test structures 55 such as this can be provided on any semiconductor chips having planarization layers in order to be able to check the reliability of the production, and on the other hand, to be able to assign causes to production failures.

FIGS. 14 and 15 show an additional possibility, besides the test structure 55, for testing an electrical connection, with the connection being tested by way of bottom measuring through-contacts 79 to 82, deep measuring interconnects 75 to 78, foot regions of the test columns 64, bottom measuring interconnects 37 to 40, and measuring through-contacts 51 to 54, it being possible by these means to determine whether the measuring through-contacts 51 to 54 and 79 to 82 are functioning effectively by testing the electrical connection between the second measuring contact surfaces 47 to 50 and the third measuring contact surfaces 71 to 74.

We claim:

1. An electronic component, comprising:

a semiconductor chip having a test structure disposed thereon and at least two corner regions, one of said at least two corner regions having no adhesion regions;

said test structure having a multi-layer coating including:
at least one interconnect layer;
a bottom insulation layer;
a top insulation layer having a top side; and
an intermediate planarization layer having embedded adhesion regions and a bottom side;

said test structure including:
a measuring through-contact;
a top measuring interconnect disposed on said top side of said top insulation layer;
a bottom measuring interconnect disposed on said bottom side of said planarization layer;
a first measuring contact surface disposed on said top side of said top insulation layer and connected to said top measuring interconnect;
a second measuring contact surface disposed on said top side of said top insulation layer and connected through said measuring through-contact to said bottom measuring interconnect; and
at least one test through-contact extending through said planarization layer and electrically connected to said top measuring interconnect and to said bottom measuring interconnect.

2. The electronic component according to claim 1, wherein:

at least one of said corner regions includes at least one of said adhesion regions; and said at least one of said adhesion regions is angular stripe-shaped.

3. The electronic component according to claim 1, wherein:

at least one of said corner regions includes at least one of said adhesion regions; and said at least one of said adhesion regions is square-shaped.

4. The electronic component according to claim 1, wherein:

at least one of said corner regions includes at least one of said adhesion regions; and said at least one of said adhesion regions has rounded contours.

* * * * *